United States Patent [19]
Dang

[11] Patent Number: 5,931,962
[45] Date of Patent: Aug. 3, 1999

[54] METHOD AND APPARATUS FOR IMPROVING TIMING ACCURACY OF A SEMICONDUCTOR TEST SYSTEM

[75] Inventor: Alexander T. Dang, Saratoga, Calif.

[73] Assignee: Xilinx, Inc., San Jose, Calif.

[21] Appl. No.: 08/717,650

[22] Filed: Sep. 23, 1996

[51] Int. Cl.[6] .................................................. H04B 17/00
[52] U.S. Cl. ............................................................ 714/731
[58] Field of Search .............................. 371/22.36, 22.1, 371/22.31; 714/731, 724, 726

[56] References Cited

U.S. PATENT DOCUMENTS 4,383,218  5/1983  Hansen et al. ........................... 324/225
5,491,649  2/1996  Friday, Jr. et al. ...................... 364/579

*Primary Examiner*—Phung M. Chung
*Attorney, Agent, or Firm*—Edel M. Young; Adam H. Tachner

[57] ABSTRACT

A semiconductor testing system that performs real-time adjustment of programmed values for test signals using an interface between a system controller and the pin resources. The interface includes a calibration memory that contains timing offset values and amplitude level offset and gain values. An arithmetic logic unit combines these compensation values with the programmed values. The compensated values are then sent to test system registers that control pin resources, such as pin electronics of the semiconductor testing system.

22 Claims, 3 Drawing Sheets

METHOD AND APPARATUS FOR IMPROVING TIMING ACCURACY OF A SEMICONDUCTOR TEST SYSTEM

BACKGROUND OF THE INVENTION

1. Field of the Invention

The present invention relates to the field of semiconductor testing systems; more particularly, the present invention relates to compensating for inaccuracies of stimulus (test) signals as seen by the semiconductor device under test (DUT).

2. Related Art

The goal of semiconductor, or integrated circuit (IC), testing is to determine whether an IC meets its functional design specification. Functional testing consists of applying a number of electronic test signals to the input pins of an IC and measuring the resulting signals on its output pins. Each test signal consists of a test pattern created by a test pattern generator to simulate the system environment in which the IC is intended to operate. A test signal generator controls the speed and the time at which each test signal is applied to the IC pins, and enables timing measurements of the output signals. These signals and their timing are generated by pattern data and timing marker values. The signal amplitude level of these test signals must be able to change to meet the requirements of the semiconductor device family, i.e., ECL, TTL, etc. As such, each electronic test signal is derived from a set of digital timing values and a set of digital amplitude values. Modern semiconductor test systems typically have six timing marker values to generate all different timing waveforms and as many as seven reference analog levels for controlling signal amplitude and current requirements. The timing and amplitude values are programmed by the system operator.

FIG. 1 illustrates a prior art testing system. Referring to FIG. 1, the testing system includes a tester controller 111 and a tester mainframe 110. The tester controller 111 typically comprises a personal computer or work station. As shown, for purposes of explanation, the tester controller 111 comprises a central processing unit (CPU) 111A coupled to a disk memory 111B via a bus. The tester mainframe 110 comprises a timing generator 120 having timing and level registers, such as timing register 131 and level register 132. Pin electronics 130 are coupled to the timing and level registers in the test signal generator 120 and are also coupled to the device under test (DUT). When operating, the CPU 111A runs a program that sends programmed timing and amplitude values to the tester mainframe 110 for storage in timing registers, upon which the test signals are generated and driven to the DUT using pin electronics 130 in a manner well-known in the art.

Each test signal is characterized by its timing and its amplitude. With respect to the timing, the test signal is supposed to be at a particular state at a particular time. One problem in prior art systems is that by the time the test signals arrive at the device under test (DUT), their timing may not be accurate due to signal propagation through many electronic circuits and cables in the testing system (e.g., in the tester mainframe). The edge of the test signal is an indication of when the signal arrives. A test signal may arrive too early to the DUT when the edge of the signal rises too quickly (i.e., the slope of the edge is steep). On the other hand, a test signal may arrive too late to the DUT when the edge rises too slowly (i.e., the slope of the edge is shallow). A fraction of a microsecond too early or too late may affect the results of testing, and thus affect the yield, because the DUT would not receive the test signals at the correct time and would fail to function correctly. In other words, devices that operate correctly may be rejected due to inaccurate test signals.

The problem of timing accuracy of test signals in prior art semiconductor testing systems is compounded by the non-linearity of the test signals. As discussed above, the test signals are generated from programmed timing and amplitude values. Ideally, the tester should be able to output a test signal that matches its programmed value. For instance, if a signal is programmed to be 5 volts, the signal produced by the tester at the input of the DUT should be 5 volts. However, prior art semiconductor test systems do not have a perfectly linear response to the programmed values. That is, the actual amplitude of the resulting test signal may not be at the programmed level.

In the prior art, to compensate for timing inaccuracies due to unequal electrical cable length and the non-linear response of the testing circuitry, calibration is performed. To correct for amplitude inaccuracies, an offset and a gain factor are applied to programmed amplitude values. Using the offset, a test signal having a zero volt amplitude is generated by a programmed value of zero volts. Even though the offset adjusts the amplitude to ensure a programmed value of zero volts, a gain factor may also be required to adjust the linear response of the system for other programmed voltage values. The gain factor, which may be either positive or negative, compensates for the specific voltage offset for an individual test signal so as to adjust the system response to be as close to linear as possible (i.e., a programmed value of 1 volt results in a test signal amplitude of 1 volt, a programmed value of 2 volts results in a test signal amplitude of 2 volts, etc.). There may be more than one gain factor.

In prior art semiconductor test systems, level and timing calibrations are performed through calibration software to compensate for test signal inaccuracies. The calibration software resides and runs in the tester controller. During calibration, the tester controller sends a predefined set of programmed values to the tester mainframe 110, which generates timing signals. Well-known comparison circuitry (not shown) is coupled to the pin electronics 130 to measure the test signals that are generated. The calibration software determines the differences between the programmed and measured timing and level values of each test signal, and stores them in a table in a general purpose memory such as disk file 111B. Then, based on these differences, the calibration software adjusts the amplitude and timing of the test signals by adjusting the programmed values. For instance, the calibration software may apply (add or subtract) an amplitude offset to the test signal and also multiply the amplitude of the test signal by the gain factor. The arithmetic operations are performed by the CPU (e.g., CPU 111A) of the tester controller. Thus, all of the adjustments to the programmed values are made under the control of the tester controller.

A problem with software calibration systems is that for every input signal, its programmed value must be read and then compensated by the CPU. The CPU must access the table of compensation values in the disk file, locate and obtain the compensation factor(s) from the table, and then perform all of the necessary arithmetic operations. Thus, the disk file must be accessed for each programmed value prior to setting up test system registers. The disk accesses are slow, causing the generation of test signals with the desired timing and amplitude to be slowed as well. Also the CPU of the tester controller is required to perform all of the compensation while being responsible for generating test patterns as well. In applications where a large number of test signals need to be applied to the input pins of the DUT because of, for instance, device characterization, schmoo (varying at least one parameter to see device behavior, e.g., varying the power supply voltage to see how the device is functioning in response to the adjustment), etc., there would be a large time overhead before testing can begin as each programmed value undergoes the correction process. It would be desirable to compensate programmed values used to generate test signals while avoiding the overhead and the problems associated with the prior art software calibration.

SUMMARY OF THE INVENTION

A semiconductor testing system and method for using the same are described. The semiconductor testing system comprises a compensation unit, separate from the tester controller, that receives uncompensated programmed values from a tester controller during testing and adjusts these programmed values to compensate for test signal inaccuracy in real-time. After compensation, the values are used by the test signal generator, which generates and applies test signals to a device under test (DUT). Because the compensation unit is separate from the tester controller, the present invention does not have to perform disk accesses nor utilize extensive CPU time of the tester controller to perform the compensation.

In one embodiment, the compensation unit comprises a calibration memory to store timing and voltage level adjustment values to adjust the programmed values.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A semiconductor testing system and method for using the same are described. In the following detailed description of the present invention, numerous specific details are set forth, such as numbers of timing markers, signal names, reference levels, etc., in order to provide a thorough understanding of the present invention. However, it will be apparent to one skilled in the art that the present invention may be practiced without these specific details. Well-known structures and devices are shown in block diagram form, rather than in detail, in order to avoid obscuring the present invention.
Overview of the Present Invention The semiconductor testing system comprises a compensation unit, separate from the tester controller, that receives uncompensated programmed values from a tester controller during testing and adjusts these programmed values to compensate for test signal inaccuracy in real-time. After compensation, the values are used by the test signal generator, which generates and applies test signals to a device under test (DUT). Because the compensation unit is separate from the tester controller, the present invention does not have to perform disk accesses nor utilize extensive CPU time of the tester controller to perform the compensation.

The compensation unit comprises hardware that uses stored correction parameters which are accessed in real-time to compensate for any non-linearity and timing offset of its test signals. By operating in real-time, the present invention corrects the programmed values on the fly while engaged in generating the test signals for a DUT. Furthermore, the timing and level correction performed with the hardware compensation unit removes all overhead associated with disk file access and CPU activities (addition, subtraction, and multiplication) of the prior art. This removal of the overhead significantly speeds up test applications.

The present invention is applicable to a wide range of testing systems, including, but not limited to, those that test application specific integrated circuits (ASICs), field programmable gate arrays (FPGAs), programmable logic devices (PLDs), or other semiconductor devices.

Figure 1:
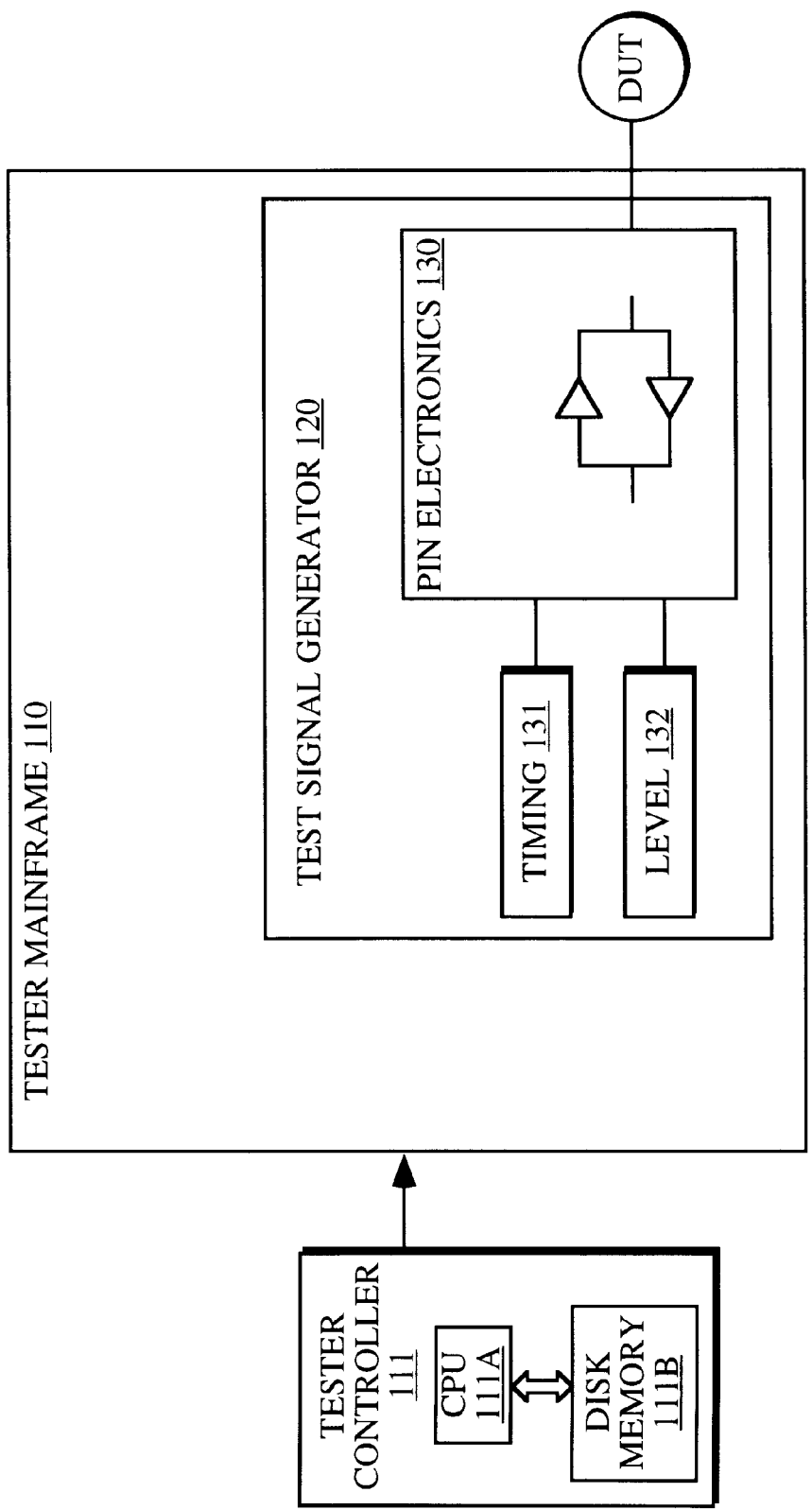
FIG. 1 illustrates a prior art semiconductor tester.
Figure 2:
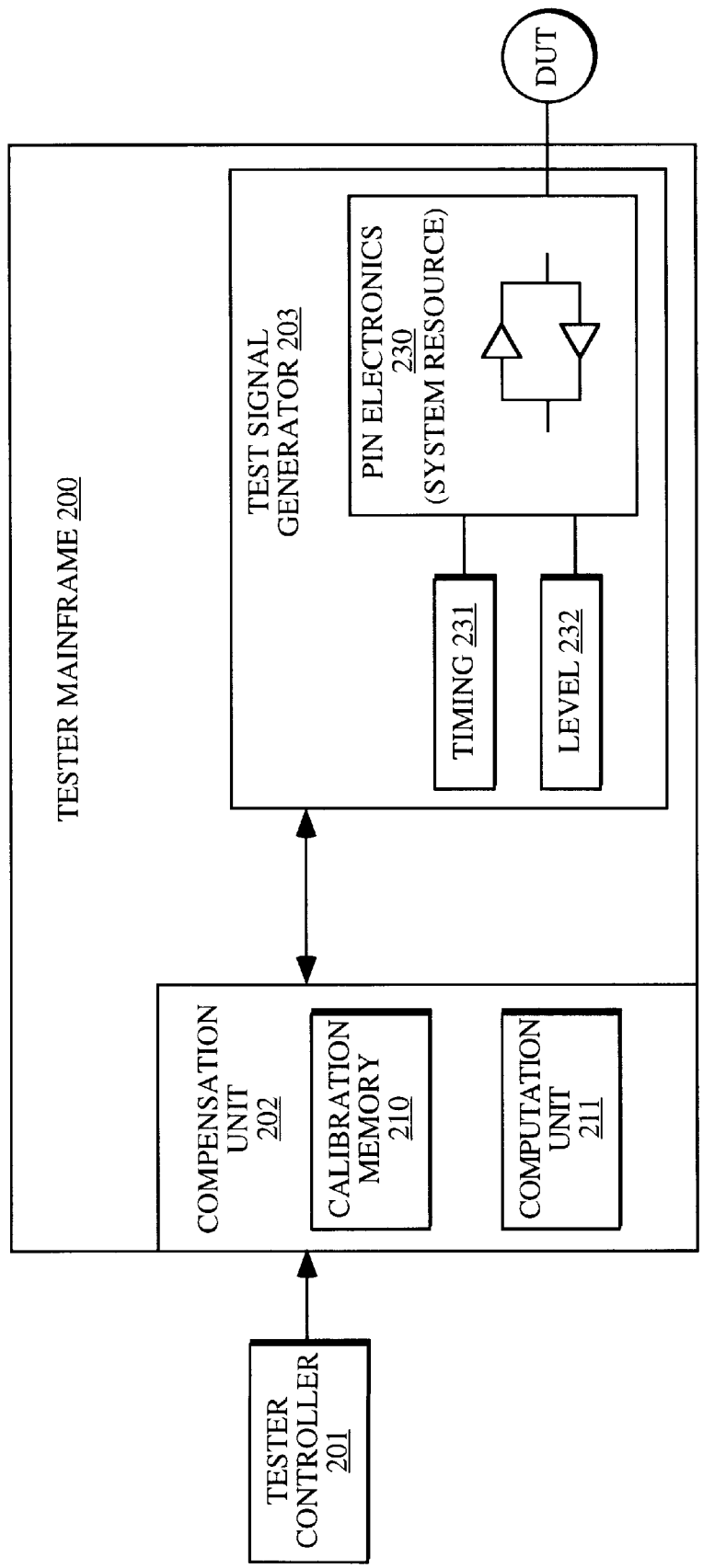
FIG. 2 illustrates one embodiment of the semiconductor tester of the present invention.

FIG. 2 illustrates one embodiment of the semiconductor testing system of the present invention. Referring to FIG. 2, the testing system 200 comprises a tester controller 201 and tester mainframe 200. The tester controller 201 provides programmed values for each of the test signals that are to be applied to the DUT during testing. The tester mainframe 200 comprises a compensation unit 202 coupled to a test signal generator 203. The compensation unit 202 receives the programmed values from the tester controller 201 in real-time during testing and adjusts the programmed values to compensate for timing signal inaccuracy. The compensation unit 202 outputs corrected values to the test signal generator 203, where they are stored in various test system registers, such as timing register 231 and level register 232. The test signal generator 203 uses the values in the test system registers to generate the test signals for testing individual DUTs. Thus, the compensation unit 202 acts as an interface between the tester controller 201 and the test signal generation 203 and is able to correct for timing signal inaccuracies during testing. In one embodiment, the compensation unit 202 comprises a hardware logic circuit.

In one embodiment, the programmed values that may require calibration include six timing markers and seven reference levels. The six timing markers comprise drive and compare markers that include a marker to turn on the test signal at an end or beginning point of a cycle, a marker to turn off the test signal at an end or beginning point of a cycle, a marker to turn on the test signal during the cycle, a marker to turn off the test signal during the cycle, and two markers to strobe the data as valid. The seven reference levels include driver voltage high (DVH), driver voltage low (DVL), comparator voltage high (CVH), comparator voltage low (CVL), tri-state voltage ($V_z$), current output high (IOH), and current output low (IOL). These six timing markers and seven reference levels are well-known in the art.

Note that the tester mainframe 200 may be subject to control by any number and type of tester controllers. In an alternate embodiment, the compensation unit 202 is a separate unit outside of the tester mainframe 200.

The compensation unit 202 includes a calibration memory 210 that stores timing and amplitude level adjustment values to adjust the programmed values. In one embodiment, the timing adjustment values comprise timing marker offset values and the amplitude level adjustment values comprise amplitude level offsets and the amplitude level gain values (e.g, gain factors). In one embodiment, the different types of adjustment values are stored in separately addressable memory banks. In an alternative embodiment, the different types of adjustment values are stored together in one or more memories.

As timing marker and level reference registers are accessed during test operations, the associated adjustment values contained therein are combined with the programmed values. The compensation unit 202 includes a computation unit 211 to combine the programmed values with the timing and amplitude level adjustment values. For instance, the programmed value stored for each timing marker is a value indicative of the delay with respect to an internal timing reference of when the signal changes state. The computation unit 211 applies each timing offset to the value in the register to change the delay associated with the timing marker to ensure proper timing. In one embodiment, data processing can be performed by using a simple, off-the-shelf arithmetic logic unit (ALU) or special purpose hardwired logic.

After the programmed values are adjusted, the adjusted values, in digital form, are written to the test signal generator 203. In one embodiment, the adjusted programmed values are written within the same register-write bus cycle into timing and level registers, such as exemplary timing register 231 and exemplary level register 232, respectively, in the test signal generator 203.

The test signal generator 203 includes test system registers such as timing register 231 and level register 232 and system resources such as pin electronic 230 coupled to the test system registers to generate the test signals based on the adjusted programmed values. A formatter (not shown to avoid obscuring the invention), including a digital drive and timing comparison circuitry interfaces the test system registers to the pin electronics.

The test system registers store the adjusted programmed values. The test signals generated are applied to the DUT. Note that in one embodiment, there is a timing register and a level register for each pin being tested on the DUT. In one embodiment, the test system registers comprise register pairs. One register in each pair stores timing information, while the other stores amplitude level information. In one embodiment, all of the timing registers are on one circuit board (or card), while all of the level registers are on another.

Each register pair is associated with a system resource such as a pin electronic that comprises a driver for driving the test signal to the DUT and a receiver to receive signals from the DUT generated in response to the test signal, where the input of the driver is coupled to the output of the receiver and the output of the driver is coupled to the input of the receiver. Pin electronics are well-known in the art.

Although the pin electronic 230 is shown as part of the tester mainframe 211, the pin electronics may be located in an area adjacent and peripheral to the DUT.

Figure 3:
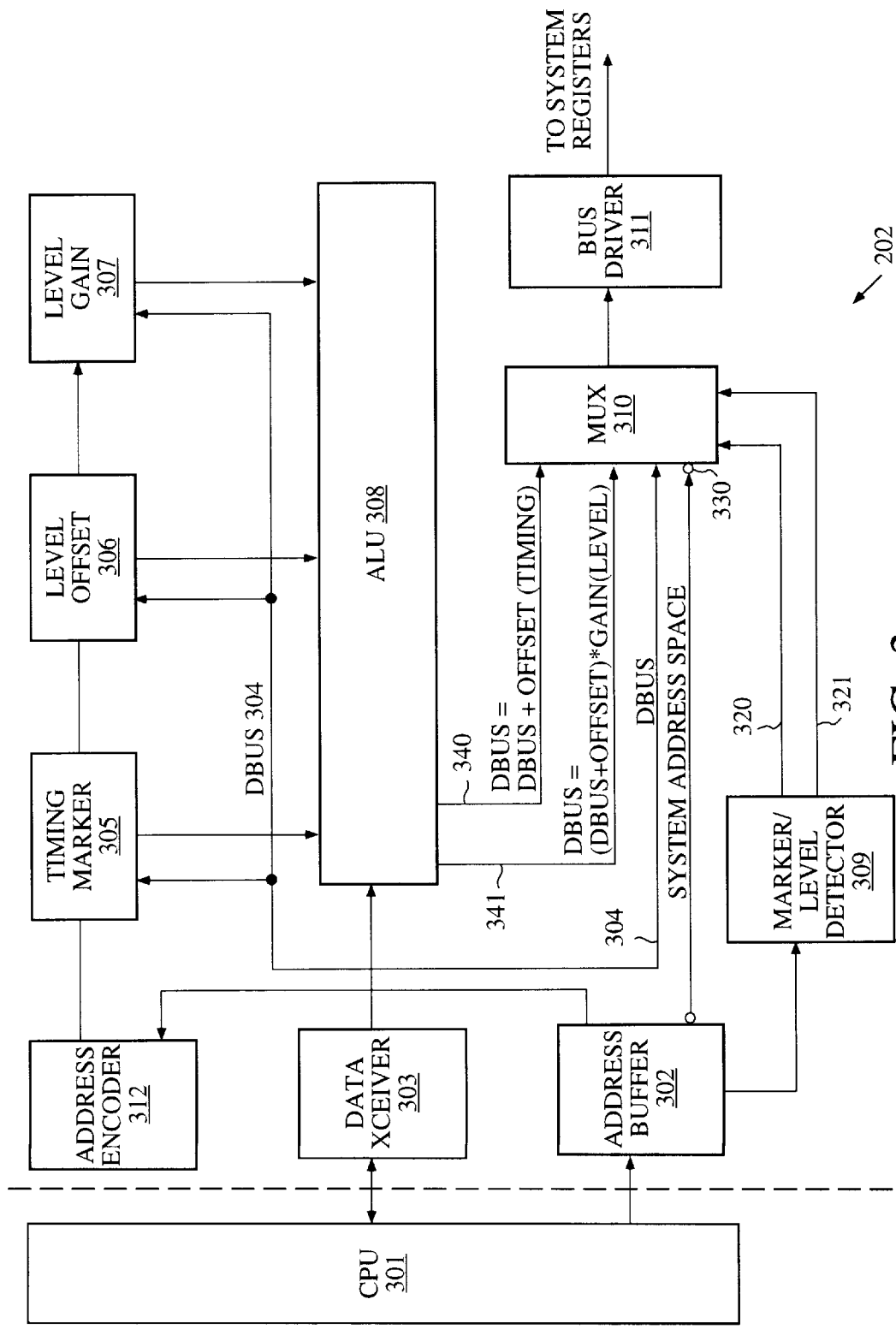
FIG. 3 illustrates one embodiment of the compensation unit of the present invention.

FIG. 3 illustrates one embodiment of the compensation unit 202. Referring to FIG. 3, a central processing unit (CPU) 301 in the tester controller 201 is coupled to an address buffer 302 and a data transceiver 303 of the compensation unit 202. The CPU 301 uses data transceiver 303 to send programmed values to ALU 308. At the same time, the address of a system register into which the programmed values is to be written is received into address buffer 302 from the CPU 301.

The data transceiver 303 is also coupled to a data bus 304, which transfers the programmed values and adjustment values within the compensation unit 202.

A calibration memory is also coupled to data bus 304 which in one embodiment comprises a timing marker memory 305, a level offset memory 306, and a level gain memory 307. The timing marker memory 305 stores offset values to adjust individual programmed values of the timing markers. The level offset memory 306 stores level offsets to adjust the signal amplitude level of individual programmed values. The level gain memory 307 stores gain factors to adjust the signal amplitude level of individual programmed values. In one embodiment, only a single memory is used to store all of the adjustment values. In this case, each of the different types of adjustment value may be stored in different banks of the memory. In an alternative embodiment, distinct memories may store timing marker adjustment values and signal amplitude level adjustment values. During initialization, the values in the timing marker memory 305 and values in the level offset memory 306 are set to 0, while the values in the level gain memory 307 are set to 1.

An arithmetic logic unit (ALU) 308 is coupled to data bus 304. The ALU 308 receives both the programmed values and the adjustment values from data bus 304 and performs addition, subtraction, multiplication, and/or any other arithmetic operation necessary to apply the adjustment values to the programmed values.

In one embodiment, the ALU 308 has two outputs that are coupled to a multiplexer (MUX) 310. One of the outputs (340) is the calibrated timing marker value corresponding to a programmed value from the tester controller 101 plus the timing offset from the timing marker memory 305. The other output (341) of the ALU 308 is the calibrated level value corresponding to a programmed value from the tester controller plus the signal amplitude offset from level offset memory 306, the result of which is multiplied by a gain factor from level gain memory 307.

Both outputs of the ALU 308 and the data bus 304 are coupled to inputs of the MUX 310, which outputs one of its inputs based on two selection inputs 320 and 321 from a marker/level detector 309. The detector 309 is coupled to receive the current address of a system register from the address buffer 302 and sets the two selection inputs 320 and 321 based on the current address in the address buffer 302. If the address corresponds to a timing marker register, then the calibrated timing signal output from the ALU 308 is selected as the output of the MUX 310. On the other hand, if the address corresponds to a level register, then the calibrated signal level is selected as the output of the MUX 310. If the address does not correspond to either a timing marker register or a level register, then the data on the data bus 304 is selected and output from the MUX 310. This direct data path (304) to the MUX 310 allows the testing system to bypass the compensation unit 202 and send data directly to the test signal generator 203 during the internal system power up.

Once the system registers have been programmed, the testing system is internally run to obtain actual data to indicate to the testing system what values need to undergo some type of calibration. Based on the actual data received, the calibration adjustment values may be determined. Such a determination is well-known in the art and will not be described in further detail.

The output of MUX 310 is coupled to a bus driver 311, which drives the calibrated values to the system registers in the tester. Each of the system registers is associated with and controls the operation of a system resource (e.g., pin electronics) in a manner well-known in the art.

The MUX 310 includes an enable input 330 that is coupled to an output of address buffer 302. The MUX 310 is enabled as long as the address received by address buffer 302 is within the system memory range allocated to the system registers. Allowing the MUX 310 to be enabled only for addresses in the system memory range ensures that the CPU 301 writes only to the system registers, and not to another portion of the system memory space.

In one embodiment, the timing marker memory 305, level offset memory 306 and the level gain memory 307 are organized as individual contiguous memories. Each timing signal uses one system pin resource, a pin electronic, which has many unique addresses assigned to it. In one embodiment, each pin electronic has 13 unique addresses assigned to it (i.e., the 6 timing markers and 7 voltage and current references). The locations corresponding to the 13 addresses are typically located in consecutive memory locations. However, since separate contiguous memories are used to store adjustment values, the address locations of the adjustment values for the timing marker and level reference registers are not consecutive. Therefore, the present invention includes an address encoder 312 to access memories 305–307. The address encoder 312 is coupled to receive the current address from address buffer 302. In this manner, the calibration memory is optimized by grouping address locations using a simple encoder circuit.

In an alternate embodiment, the offset and gain adjustment values are stored in a non-contiguous memory space, either on- or off-chip.

The size of the memory is determined by the number of pin resources of the testing system times the number of timing markers and level values. For example, a 512-pin test system would require 6656 (=512×13) address locations. The default state of the calibration memory (e.g., timing marker memory 305, level offset memory 306, and level gain memory 307) is for read access. A mode bit (not shown) may be used to allow writing to the calibration memory during test system calibration.

Whereas many alterations and modifications of the present invention will no doubt become apparent to a person of ordinary skill in the art after having read the foregoing description, it is to be understood that the various embodiments shown and described by way of illustration are in no way to be considered limiting. Therefore, reference to the details of the various embodiments are not intended to limit the scope of the claims which themselves recite only those features regarded as essential to the invention.

Thus, a semiconductor testing system has been described.

I claim:

1. A semiconductor testing system comprising:
    a compensation unit coupled to receive programmed values during testing and to adjust the programmed values to compensate for timing signal inaccuracy; and
    a test signal generator coupled to the compensation unit to generate test signals in response to the adjusted programmed values.

2. The system defined in claim 1 wherein the compensation unit comprises a calibration memory to store timing and amplitude level adjustment values to adjust the programmed values.

3. The system defined in claim 2 wherein the calibration memory comprises:
    a first memory to store timing marker offset values; and
    a second memory to store amplitude level offset and voltage gain values.

4. The system defined in claim 3 wherein the second memory comprises:
    a third memory to store amplitude level offset values; and
    a fourth memory to store voltage gain offset values.

5. The system defined in claim 2 wherein the compensation unit further comprises an arithmetic unit to combine the programmed values with the timing and amplitude level adjustment values.

6. The system defined in claim 1 wherein the adjusted programmed values are written into timing and level registers in the test signal generator within the same register-write bus cycle.

7. The system defined in claim 1 wherein the test signal generation unit comprises:
    a plurality of test system registers to store the adjusted programmed values;
    a plurality of system resources, each coupled to individual test system registers, to generate the test signals based on the adjusted programmed values.

8. The system defined in claim 7 wherein the plurality of test system registers comprises a plurality of register pairs individually associated with the plurality of system resources, wherein a first register in each of the plurality of pairs is configured to store timing information associated with a test signal and a second register is configured to store amplitude level information associated with the test signal.

9. The system defined in claim 7 wherein each of the plurality of system resources comprises a pin electronics.

10. A semiconductor testing system comprising:
    a compensation unit including:
    a receiving circuit for receiving test parameters used to generate test signals having predetermined timing relationships with timing signals;
    a memory for storing adjustment parameters used to generate test signals;
    a processing unit for adjusting the test parameters for timing signal inaccuracies based on the adjustment parameters; and
    a plurality of test system registers coupled to the compensation unit to store the adjusted test parameters; and
    a plurality of system resources, each coupled to individual test system registers, to generate the test signals based on the adjusted test parameters.

11. The system defined in claim 10 wherein the memory comprises:
    a first memory to store timing marker offset values;
    a second memory to store amplitude level offset values; and
    a third memory to store amplitude level gain offset values.

12. The system defined in claim 11 wherein the compensation unit further comprises:
    a bus coupled to the first, second, and third memories; and
    an arithmetic unit coupled to the bus to combine the test parameters with the timing marker and amplitude level offset values.

13. The system defined in claim 10 wherein the adjusted test parameters are written into the test system registers within a same register-write bus cycle.

14. The system defined in claim 10 wherein the plurality of test system registers comprises a plurality of register pairs individually associated with the plurality of system resources, wherein a first register in each of the plurality of pairs is configured to store timing information associated with a test signal and a second register is configured to store amplitude level information associated with the test signal.

15. The system defined in claim 10 wherein each of the plurality of system resources comprises a pin electronics.

16. A semiconductor testing system comprising:
    an interface responsive to test parameters for generating test signals having predetermined timing relationships with timing signals from a timing signal generator, for performing hardware timing adjustment to the test parameters for timing signal inaccuracies; and a plurality of individual test signal registers coupled to the interface, for receiving and storing the adjusted test parameters to control individual tester resources.

17. The system defined in claim 16 wherein the tester resources comprise pin electronics.

18. The system defined in claim 16 wherein the interface comprises a memory to store timing and reference parameters.

19. The system defined in claim 18 wherein the parameters comprise timing markers.

20. The system defined in claim 18 wherein the parameters comprise amplitude level offset and gain parameters.

21. The system defined in claim 18 wherein the memory comprises:

a first memory storing timing offset parameters;

a second memory storing level offset parameters; and a third memory storing gain parameters.

22. The system defined in claim 16 wherein the interface comprises an arithmetic logic unit operable to perform arithmetic operations on the test parameters provided by the timing generator to adjust timing signals.

* * * * *